(12) United States Patent
Shim et al.

(10) Patent No.: US 12,454,505 B2
(45) Date of Patent: Oct. 28, 2025

(54) METHOD FOR PURIFYING AN ALKYLENE GLYCOL MONOALKYL ETHER CARBOXYLIC ACID ESTER HAVING HIGH-PURITY USED IN PHOTO RESIST PROCESS

(71) Applicant: JAEWON INDUSTRIAL CO., LTD, Yeosu-si (KR)

(72) Inventors: Sung Won Shim, Yeosu-si (KR); Byung Ki Son, Daejeon (KR); Hwan Choi, Yeosu-si (KR); Youn Soo Shin, Yeosu-si (KR); Hwa Yeong Choi, Yeosu-si (KR); Ho Jeong, Jeollanam-do (KR)

(73) Assignee: JAEWON INDUSTRIAL CO., LTD, Yeosu-si (KR)

( * ) Notice: Subject to any disclaimer, the term of this patent is extended or adjusted under 35 U.S.C. 154(b) by 583 days.

(21) Appl. No.: 17/934,099

(22) Filed: Sep. 21, 2022

(65) Prior Publication Data

US 2023/0095681 A1    Mar. 30, 2023

(30) Foreign Application Priority Data

Sep. 27, 2021    (KR) ........................ 10-2021-0127311

(51) Int. Cl.
    *C07C 67/56*    (2006.01)
    *C07C 67/54*    (2006.01)
    *G03F 7/16*     (2006.01)

(52) U.S. Cl.
    CPC .............. *C07C 67/56* (2013.01); *C07C 67/54* (2013.01); *G03F 7/161* (2013.01)

(58) Field of Classification Search
    CPC ......... C07C 67/54; C07C 67/56; C07C 67/62; C07C 69/14; C07C 69/708; G03F 7/0048; G03F 7/161
    See application file for complete search history.

(56) References Cited

FOREIGN PATENT DOCUMENTS

| CN | 101049550 A    |   | 10/2007 |
|----|----------------|---|---------|
| CN | 108727191      | * | 11/2018 |
| CN | 108727191 A    |   | 11/2018 |
| JP | 2010-501124 A  |   | 1/2010  |
| KR | 10-2004-0075431 A |   | 8/2004 |
| KR | 10-2003-0043190 A |   | 4/2005 |
| KR | 10-0869333 B1  |   | 11/2008 |
| KR | 10-2009-0131538 A |   | 12/2009 |
| KR | 10-2010-0102644 A |   | 9/2010 |
| KR | 10-2012-0024310 A |   | 3/2012 |
| KR | 10-1274477 B1  |   | 6/2013  |
| KR | 10-1282799 B1  |   | 7/2013  |
| KR | 10-1306336 B1  |   | 9/2013  |
| WO | 2009/031731 A1 |   | 3/2009  |
| WO | 2018/051716 A1 |   | 3/2018  |
| WO | WO2018051716   | * | 3/2018  |
| WO | 2018/192195 A1 |   | 10/2018 |

OTHER PUBLICATIONS

CN108727191 translation (Year: 2018).*
WO2018051716 translation (Year: 2018).*
The Chinese Office Action for corresponding CN202211148278.4, issued on Apr. 3, 2024, 8 pages.
The Notice of Allowance for JP 2022-152939 A issued on Jan. 23, 2024, one page.
The Japanese Office Action for corresponding JP 2022-152939, issued Aug. 15, 2023, 3 pages.
The Korean Notice of Allowance for corresponding KR 10-2021-0127311, issued Oct. 4, 2023, 2 pages.

* cited by examiner

*Primary Examiner* — Andrew D Kosar
*Assistant Examiner* — Blaine G Doletski
(74) *Attorney, Agent, or Firm* — Vorys, Sater, Seymour and Pease LLP; Mih Suhn Koh

(57) ABSTRACT

Provided is a method for purifying an alkylene glycol monoalkyl ether carboxylic acid ester (AGAECE) for photoresist processing, wherein the method comprises the step of distillation after passing industrial AGAECE through a porous adsorbent impregnated with a basic material, and it is possible to obtain a semiconductor-grade high-purity AGAECE maintaining a low acid value and high purity according to the present invention.

10 Claims, 2 Drawing Sheets

METHOD FOR PURIFYING AN ALKYLENE GLYCOL MONOALKYL ETHER CARBOXYLIC ACID ESTER HAVING HIGH-PURITY USED IN PHOTO RESIST PROCESS

TECHNICAL FIELD

The present invention relates to a method for purifying an alkylene glycol monoalkyl ether carboxylic acid ester, and more particularly, to a method for purifying semiconductor-grade high-purity AGAECE (alkylene glycol monoalkyl ether carboxylic acid ester) used in a photoresist process utilizing an EUV/ArF light source.

BACKGROUND

A fine circuit pattern such as a semiconductor integrated circuits are manufactured by a method of uniformly applying a photoresist containing a photosensitive compound and a solvent to a conductive metal film or an oxide film formed on a substrate by a spin coating method, and then subjecting it to exposure, development, etching and peeling processes to realize a desired fine circuit pattern.

At this time, since the exposure process, which is a subsequent process, is achieved by a method of finely exposing a desired pattern onto the coating film using a short-wavelength length in the ultraviolet region, it is very sensitive to external and internal contamination.

Therefore, unnecessary photoresist residues and other contaminants applied to the edge or back surface of the substrate in the coating process may become fatal contamination sources in the subsequent exposure process, and thus must be necessarily removed. In order to remove these contaminants, a thinner has been used in an EBR (edge bead removing) process from the past.

Recently, as the degree of integration of semiconductors increases, a photoresist using a short-wavelength ArF light source or an extreme ultraviolet (EUV) light source has been applied, and as the effects of the usage of photoresist on the integrated circuit production cost increases significantly, there has been a continuous demand to reduce the photoresist usage for cost reduction.

In order to meet these demands, a RRC (reducing resist consumption) process, in which by treating the surface of the substrate with a thinner before applying the photoresist, the photoresist is evenly applied to the entire surface of the substrate even if only a small amount of photoresist is used, has been applied. As the diameter of the substrate (wafer) increases along with the increase in the degree of integration, the importance of the RRC process is increasing, and thus, there is a need to develop a thinner with high RRC efficiency while sufficiently proceeding with the existing EBR process.

Among the thinner compositions used in the RRC process and the EBR process, the most important material is AGAECE (Alkylene glycol monoalkyl ether carboxylic acid ester). The purity and acidity of a photoresist material are very important in a semiconductor process, especially when forming a pattern having a fine line width using a short wavelength or extreme wavelength light source such as ArF or EUV.

Materials used in the photoresist process have very strict requirements in terms of purity, moisture, acidity, etc. For example, the semiconductor grade AGAECE is required to have a purity of 99.99%, an acidity of 20 ppm or less, and a moisture content of 50 ppm or less.

Korean Patent No. 10-1306336 and Korean Patent No. 10-1274477 disclose methods for purifying PGMEA, but these methods use waste PGMEA which maintains the purity to the extent that is used in the LCD production process as a raw material, and thus, even if it is purified, there is a problem that it cannot be used in a semiconductor grade process.

On the other hand, when the content of the acid remaining in the AGAECE used before and after applying a photoresist in a photolithography process is high, it affects the decomposition speed or curing speed of a photoresist (PR) resin, and can react with aqueous alkali solutions such as KOH and TMAH used as a developer to act as a cause of chip defect generation, and may corrode semiconductor equipment.

Therefore, in order to minimize the effect on the precision of the pattern formation process in the photoresist process, it is very important to purify industrial AGAECE, which is a raw material, to a high purity enough to be used in semiconductor processes, and at the same time, to minimize the content of residual acid.

PRIOR ART LITERATURE

Patent Literature (Patent Literature 0001) Korean Patent No. 10-1306336 (published on Sep. 9, 2013)
(Patent Literature 0002) Korean Patent No. 10-1274477 (published on Jun. 7, 2013)

DETAILED DESCRIPTION OF THE INVENTION

Technical Problem

It is an object of the present invention to provide a method for purifying an alkylene glycol monoalkyl ether carboxylic acid ester for photoresist processing in which industrial alkylene glycol monoalkyl ether carboxylic acid ester is purified by introducing adsorption process, distillation process, thereby lowering the acidity, minimizing impurities and achieving high purity.

Technical Solution

According to one aspect of the present invention, there is provided a method for purifying alkylene glycol monoalkyl ether carboxylic acid ester for photoresist process, the method comprising the steps of: impregnating a porous adsorbent with a basic material; lowering the acidity by passing an alkylene glycol monoalkyl ether carboxylic acid ester (hereinafter referred to as AGAECE) as a raw material through the porous adsorbent impregnated with a basic material; and distilling the AGAECE that has passed through the porous adsorbent. Wherein, the AGAECE is represented by the following Formula 1, and an antioxidant is added in the distillation step.

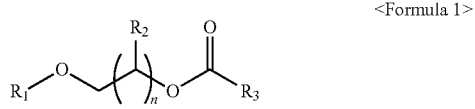

<Formula 1> wherein, $R_1$ is hydrogen or a $C_1$-$C_8$ alkyl group, $R_2$ and $R_3$ are each independently hydrogen or a $C_1$-$C_{11}$ alkyl group, and n is an integer of 1 to 11, provided that when n is an integer of 2 or more, each $R_2$ is the same as or different from each other.

Also, the method of the present invention may further include the step of passing the distilled AGAECE through a basic ion exchange resin.

The AGAECE may be propylene glycol methyl ether acetate (hereinafter referred to as PGMEA).

The purity of the raw material AGAECE is 99.90 to 99.95%, and the acidity may be 20 ppm or more.

The acidity of AGAECE after the distillation process may be less than 20 ppm, and the acidity of AGAECE after passing through the basic ion exchange resin may be less than 10 ppm.

The acidity of the raw material PGMEA is more than 100 ppm, and propylene glycol methyl ether as an impurity is contained in an amount of 45 ppm or more. The acidity of to PGMEA after the distillation process is less than 20 ppm, and the propylene glycol methyl ether may be contained in an amount of 25 ppm or less. The content of propylene glycol methyl ether contained in PGMEA after the distillation process is 25 ppm or less, and after passing through the basic ion exchange resin, the content may be 20 ppm or less.

The light source used in the photoresist process may be an EUV or ArF light source used for the ultra-fine line width process.

According to another aspect of the present invention, there is provided an alkylene glycol monoalkyl ether carboxylic acid ester purified by the above purification method. At this time, the purity of the purified alkylene glycol monoalkyl ether carboxylic acid ester may be 99.99% or more, and the acidity may be less than 20 ppm.

Advantageous Effects

According to the embodiments of the present invention, since it is possible to manufacture semiconductor grade AGAECE that maintains a low acidity and high purity, that the yield of the semiconductor manufacturing process can be improved, and the defect rate of the microprocess can be lowered, thereby improving the productivity of the semiconductor.

DETAILED DESCRIPTION OF THE EMBODIMENTS

Figure 1:
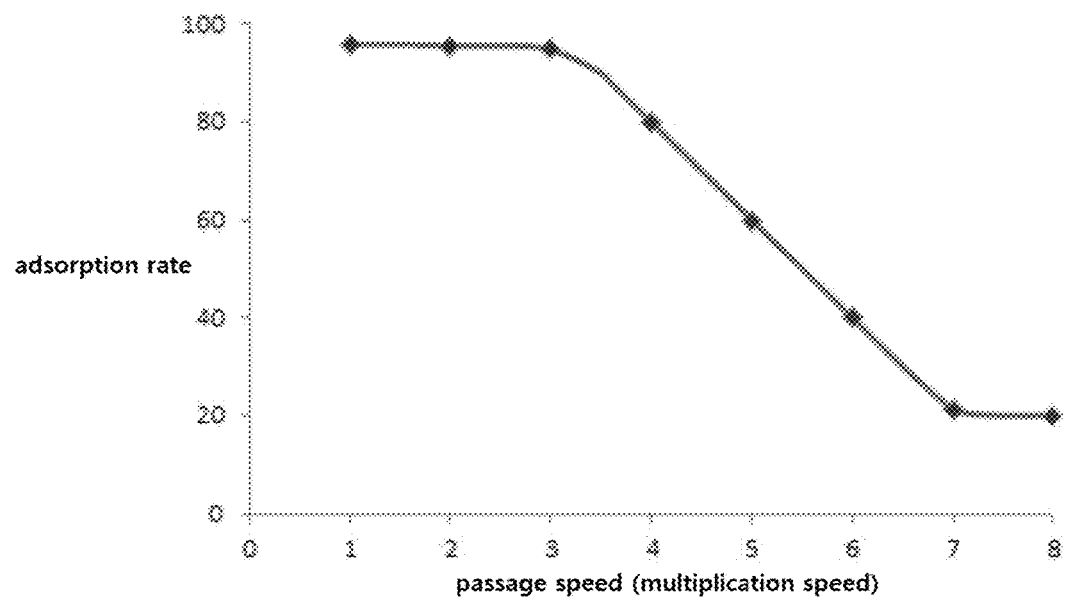
FIG. 1 is a graph showing the adsorption rate according to the speed at which PGMEA passes through a porous adsorbent.

In the description of the present invention, if it is determined that a specific description of the related known configuration or function may obscure the gist of the present invention, a detailed description thereof will be omitted.

As used herein, the term 'high purity' means a purity of 99.99% or more.

As used herein, the term 'acidity' or 'acidity value' means the amount (ppm) of an acidic material.

As used herein, the term 'alkylene glycol monoalkyl ether carboxylic acid ester' includes impurities other than alkylene glycol monoalkyl ether carboxylic acid ester (hereinafter also referred to as AGAECE). Therefore, even if the raw material AGAECE is described, it does not mean a pure AGAECE single material, but a state containing impurities, and the final refined product, AGAECE, may also contain a very small amount of impurity.

Industrial AGAECE raw materials used herein do not include those recovered through recycling. This is because, when purified and recovered through recycling, it contains multiple components, which makes it unsuitable for use in semiconductor processes, especially photoresist processes. For example, the purity of the raw material AGAECE may be 99.0% or more.

First, the alkylene glycol monoalkyl ether carboxylic acid ester (hereinafter also referred to as AGAECE) will be described.

The AGAECE is represented by the following Formula 1.

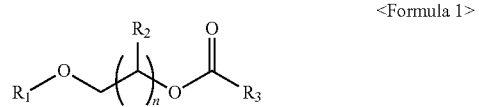

<Formula 1> wherein, $R_1$ is hydrogen or a $C_1$-$C_8$ alkyl group, $R_2$ and $R_3$ are each independently hydrogen or a $C_1$-$C_{11}$ alkyl group, and n is an integer of 1 to 11, provided that when n is an integer of 2 or more, each $R_2$ is the same as or different from each other.

The compound represented by Formula 1 may be a compound as follows, but is not limited thereto.

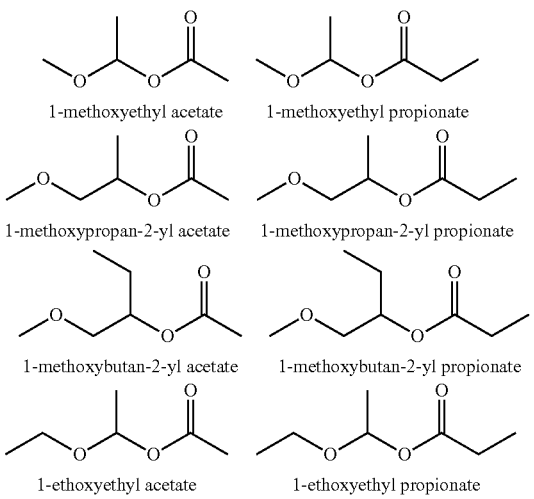

1-methoxyethyl acetate   1-methoxyethyl propionate 1-methoxypropan-2-yl acetate   1-methoxypropan-2-yl propionate 1-methoxybutan-2-yl acetate   1-methoxybutan-2-yl propionate 1-ethoxyethyl acetate   1-ethoxyethyl propionate The AGAECE can be generally prepared by the following Reaction Scheme 1.

[Reaction Scheme 1]

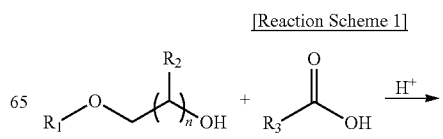

-continued

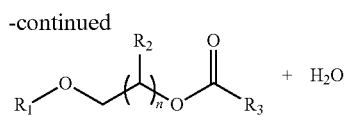

The AGAECE produced by Reaction Scheme 1 can be hydrolyzed as shown in the following Reaction Scheme 2.

[Reaction Scheme 2]

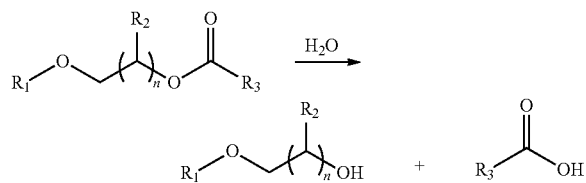

For example, propylene glycol methyl ether acetate (PG-MEA) can be prepared and hydrolyzed by the following Reaction Scheme 3.

[Reaction Scheme 3]

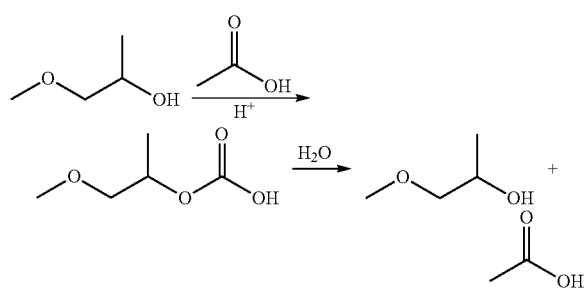

PGMEA is weak to heat and easily hydrolyzed in the presence of moisture, but it has good solvent properties, and thus, it is often used as a thinner in the photoresist process.

As can be seen from Reaction Schemes 2 and 3, when the hydrolysis reaction occurs, an impurity is included in a product, which becomes difficult to produce high-purity AGAECE, resulting in reduced efficiency of the production process. Therefore, it is necessary to remove water generated during the production process of AGAECE.

Further, the acid remaining during the production process of AGAECE may cause corrosion of semiconductor equipment, and it not only affects the decomposition speed or curing speed of the photoresist resin, but also acts as a chip defect factor by reacting with the alkali solution used in the developer, so that it must be minimized.

Therefore, according to the present invention, it is possible to purify/produce semiconductor-grade high-purity AGAECE, and the purification method of AGAECE according to an embodiment of the present invention will be described in detail below.

AGAECE purification method for photoresist process according to an embodiment of the present invention includes a step of impregnating a porous adsorbent with a basic material; a step of lowering the acidity by passing an alkylene glycol monoalkyl ether carboxylic acid ester (hereinafter referred to as AGAECE) as a raw material through the porous adsorbent impregnated with a basic material; and a step of distilling the AGAECE that has passed through the porous adsorbent.

First, AGAECE, which is a raw material, is prepared. Such raw materials contain various unknown impurities and moisture. The purity of the raw material AGAECE is 99.90 to 99.97%, preferably 99.90 to 99.95%, and the acidity of the raw material AGAECE may exceed 100 ppm.

Figure 2:
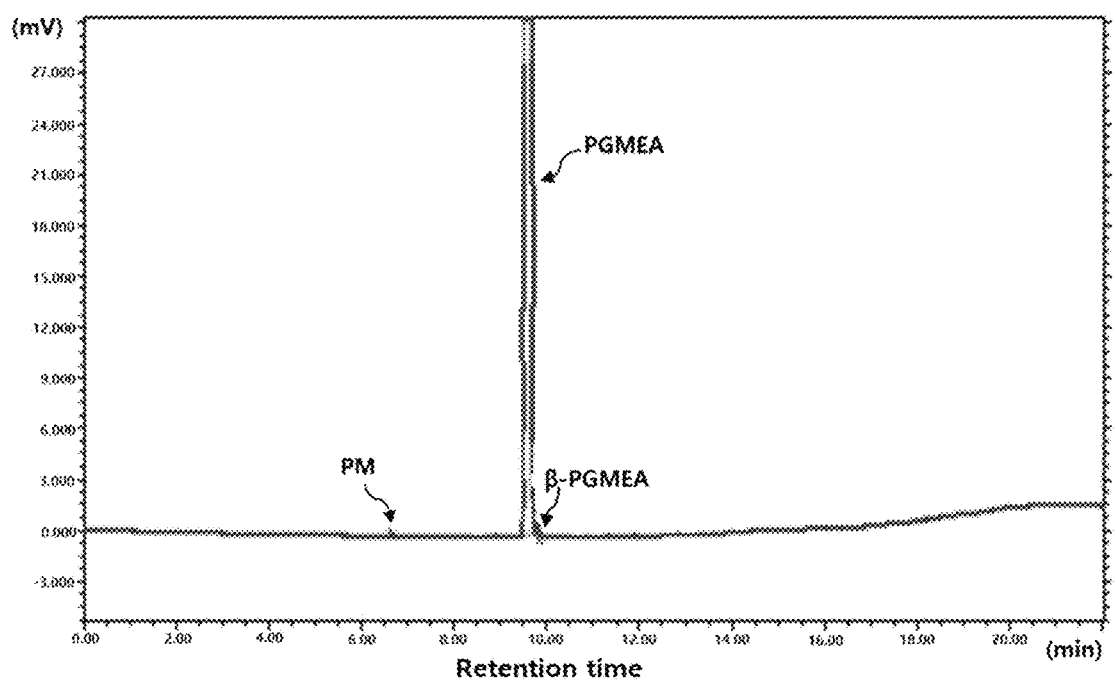
FIG. 2 is a gas chromatogram of industrial PGMEA as a raw material.

For example, in the case of PGMEA (propylene glycol methyl ether, also abbreviated as PMA), it can be seen that it contains unknown impurities, PM (propylene glycol methyl ether, also abbreviated as PGME), isomers of PGMEA, etc. before purification as shown in FIG. 2, and the purity of PGMEA is 99.94011%.

Next, the porous adsorbent is impregnated with a basic material.

The porous adsorbent may be at least one selected from the group consisting of mesoporous silica, zeolite, porous metal oxide, porous clay, activated carbon, porous activated alumina, aerogel, and MOF (metal-organic framework), but is not limited thereto, and any porous material having adsorption properties can be used.

The activated carbon may be produced using palm trees, wood, sawdust, charcoal, etc. as a raw material.

The basic material may be one or more may be selected from the group consisting of KOH, NaOH, Ba(OH)$_2$, CsOH, Sr(OH)$_2$, Ca(OH)$_2$, LiOH, RbOH, n-BuLi, Na$_2$CO$_3$, NaH, NaHCO$_3$, K$_2$CO$_3$, KHCO$_3$, CaCO$_3$, CaHCO$_2$, LDA (Lithium diisopropylamide), LDEA (Lithium diethylamide) and ((CH$_3$)$_3$Si)$_2$NLi (Lithium bis(trimethylsilyl)amide).

Water or an organic solvent may be used as a solvent of the basic material, and by using 5 to 80 parts by weight of a solute based on 100 parts by weight of the solution, a basic material having a concentration of 5 to 80 wt % can be prepared and used.

The basic material may be used in an amount of 10 to 120 parts by weight based on 100 parts by weight of the porous adsorbent.

Immediately after the porous adsorbent is impregnated with the basic material, it may be calcined at 100 to 700° C., preferably at 500 to 700° C. If the porous adsorbent is impregnated with the basic material and then calcined, the state in which the basic material is more firmly bound to the porous adsorbent can be maintained.

Next, the industrial AGAECE as a raw material is passed through a porous adsorbent impregnated with a basic material.

As described above, the acid used during the production process may remain in the raw material, industrial AGAECE, and impurities or acids may be generated by a hydrolysis reaction or the like. Water and acid can be removed by passing such a raw material, industrial AGAECE, through a porous adsorbent impregnated with a basic material.

Porous adsorbents are not reactive with AGAECE. Thus, if a base that can easily cause a neutralization reaction with an acid is deposited on such a porous adsorbent, acid and moisture can be selectively removed as the raw material AGAECE passes. Therefore, by passing AGAECE through the porous adsorbent, the effect of reducing the acidity as well as the removal of moisture can be expected.

At this time, the speed at which the raw material AGAECE passes is important. If AGAECE passes at too slow speed, the efficiency of removing acid contained in AGAECE is high, but productivity is lowered, and if AGAECE passes at too fast speed, it is difficult to effectively adsorb the acid contained in AGAECE, so that the adsorption efficiency is lowered.

Therefore, it is important to adjust the speed so that AGAECE is passed by 1 to 8 times, preferably 1 to 4 times per hour relative to the volume of the porous adsorbent. Here, the passage velocity is expressed as SV (Space Velocity), which is defined as the value obtained by dividing the throughput per hour (m³/hr) by the volume of the porous adsorbent (m³).

FIG. 1 is a graph showing the adsorption rate according to the speed at which PGMEA passes through a porous adsorbent.

Referring to FIG. 1, the adsorption rate is consistently high from SV=1 to SV=3, whereas, when SV=3 or more, the adsorption rate is significantly reduced, but at SV=7 to SV=8, the adsorption rate is very low. Therefore, it is preferable to pass AGAECE through the porous adsorbent at a speed of SV=1 to SV=8, and it is more preferable to pass at a speed of SV=1 to SV=4.

When AGAECE is passed through a porous adsorbent impregnated with a basic material, the acidity can be reduced by half. For example, if the raw material PGMEA having an acidity of 100-130 ppm is passed through a porous adsorbent impregnated with a basic material, it can be lowered to a level of 45-60 ppm.

However, even if AGAECE is passed through the porous adsorbent, it is still difficult to maintain the purity or acidity that can be used as a semiconductor grade.

Therefore, a process of distilling the AGAECE that has passed through the porous adsorbent is required (S140). That is, it is preferable to additionally remove the remaining acid and impurities through the vacuum distillation process.

In such a vacuum distillation process, a tray column or a packing column can be used, and it can be distilled at 80 to 140° C., preferably 80 to 100° C.

However, AGAECE has an ester linkage in the compound, and thus, hydrolysis is likely to occur due to moisture, and oxidation reaction is likely to occur due to heat. Therefore, during the distillation process, an impurity, alkyleneglycol monoalkyl ether, may be generated. For example, PGME as an impurity may be generated by hydrolysis during the process of distilling PGMEA.

Therefore, it is preferable to add an antioxidant during the distillation process to prevent hydrolysis and prevent the formation of impurities. At this time, as an antioxidant, the following primary antioxidants and secondary antioxidants may be added in combination or individually.

As the primary antioxidant, the most commonly used phenolic antioxidants may be products such as BHT (Butylated hydroxytoluene), MeHQ (Hydroquinone monomethylether), TBC (4-tert-Butylcatechol), HQ (Hydroquinone), Songnox 1010, Songnox 1076, Songnox 1135, Songnox 2450, or Songnox 1035.

As the secondary antioxidant, examples of the phosphite antioxidant may be tris(2,4-di-tert-butylphenyl)phosphite, bis(2,4-di-tert-butylphenyl)pentaerythritol diphosphate and the like.

The primary antioxidant and the secondary antioxidant may be added in an amount of 10 to 10,000 ppm, preferably 100 to 2,000 ppm, based on the total weight of PGMEA.

If it goes through the distillation process step, it is possible to produce AGAECE that maintains the purity and acidity at the semiconductor level.

Finally, in order to further lower the acidity of the distilled AGAECE, a process of passing through an additional basic ion exchange resin can be performed.

The basic ion exchange resin may be, for example, a gel type or porous type containing trimethylammonium or dimethyl ethanolammonium as an exchange group in a copolymer in which polystyrene and divinylbenzene are crosslinked.

The basic ion exchange resin may be any one selected from the group consisting of —OH or —Cl type, but the —OH type can more effectively remove a material having an acidity. It may be preferable that the basic ion exchange resin is strongly basic.

Similar to the step of passing through a porous adsorbent, when the AGAECE that has undergone the distillation step is passed through the basic ion exchange resin, the speed of passage is also important. AGAECE can be passed at a speed of SV=1 to SV=10, and preferably at a speed of SV=1 to SV=5.

When the AGAECE that has undergone the distillation step in this way is passed through the basic ion exchange resin, high-quality semiconductor grade AGAECE with high purity and low acidity can be produced.

The present invention will be described in more detail below with reference to examples. These examples are for illustrative purposes only, and the scope of the invention is not limited thereby.

EXAMPLES AND COMPARATIVE EXAMPLES

Example 1

The activated carbon was dried at 120° C. for 24 hours, and then 10 g of the dried activated carbon was added to 20 g of a 20 wt. % NaOH aqueous solution, and the mixture was stirred for 2 hours. The activated carbon in which NaOH has been sufficiently absorbed was maintained at 100° C. for 2 hours under a nitrogen atmosphere, then heated to 10° C./min and maintained at 600° C. for 3 hours, then cooled to room temperature and used as an adsorbent.

A glass tube with a diameter of 3 cm and a height of 10 cm was filled with 10 g of the activated carbon impregnated with NaOH, and the acidity (acid value) was measured while passing propylene glycol monomethyl ether acetate (PGMEA) at a speed of SV=3.

Next, the sample that has passed through the activated carbon impregnated with NaOH was supplied to a 30-tray distillation column with a diameter of 10 cm. While maintaining the bottom temperature of 80 to 100° C., BHT (Butylated hydroxytoluene), which is an antioxidant, was added at 500 ppm relative to the weight of the solution and distilled. Through the distillation process, it is possible to obtain PGMEA from which the acid not removed by the zeolite adsorbent has been additionally removed.

Finally, PGMEA obtained through the distillation process was passed at a speed of SV=3 using SAR-10 (Samyang Corporation) which is a strong basic ion exchange resin, to thereby prepare a semiconductor-grade high-purity PGMEA capable of using in a photoresist process.

Example 2

PGMEA was prepared in the same manner as in Example 1, except that 20 g of a 20 wt % KOH aqueous solution was used instead of NaOH as a basic material.

Example 3

Zeolite was dried at 140° C. for 24 hours, and then 10 g of the dried zeolite was added to 20 g of a 20 wt % NaOH aqueous solution, and the mixture was stirred for 2 hours. The zeolite in which NaOH has been sufficiently absorbed was maintained at 400° C. for 2 hours under a nitrogen atmosphere, then heated to 10° C./min and maintained at 600° C. for 3 hours, then cooled to room temperature and used as an adsorbent.

A glass tube with a diameter of 3 cm and a height of 10 cm was filled with 10 g of the zeolite impregnated with NaOH, and the acidity was measured while passing PGMEA at a speed of SV=3.

Next, the sample that has passed through the zeolite impregnated with NaOH was supplied to a 30-tray distillation column with a diameter of 10 cm. While maintaining the bottom temperature of 80 to 100° C., TBC (4-tert-butylcatechol), which is an antioxidant, was added at 500 ppm relative to the weight of the solution and distilled. Through the distillation process, it is possible to obtain PGMEA from which the acid not removed by the zeolite adsorbent has been additionally removed.

Finally, PGMEA obtained through the distillation process was passed at a speed of SV=3 using SAR-10 (Samyang Corporation) which is a strong basic ion exchange resin, to thereby prepare a semiconductor-grade high-purity PGMEA capable of using in a photoresist process.

Example 4

PGMEA was prepared in the same manner as in Example 1, except that the granular activated carbon in which NaOH was sufficiently absorbed was maintained at 400° C. for 2 hours under a nitrogen atmosphere.

Comparative Example

PGMEA was prepared in the same manner as in Example 1, except that activated carbon was impregnated in 20 g of water instead of NaOH.

The acidity and amount of impurity PM (propylene glycol methyl ether) of the materials (hereinafter, it is also referred to as PGMEA, but it means a composition containing an to extremely small amount of impurity rather than a pure single material PGMEA) obtained in each step in Examples 1 to 4 and Comparative Examples are as show in Tables 1 to 5 below.

Table 1 below shows the measurement of the acidity of PGMEA passing through the porous adsorbent according to the passage multiplication factor. Here, the passage scale factor means the accumulated amount of PGMEA that has passed through a porous adsorbent.

TABLE 1

Acidity of PGMEA after passing through porous adsorbent (Unit: ppm)

| Passage scale factor | Feed | 0-50 | 50-100 | 100-150 | 150-200 | 200-250 | 250-300 | 300-350 | 350-400 | 400-450 |
|---|---|---|---|---|---|---|---|---|---|---|
| Example 1 | 123 | 55 | 53 | 52 | 55 | 57 | 52 | 52 | 54 | 53 |
| Example 2 | 123 | 54 | 55 | 53 | 55 | 52 | 51 | 52 | 54 | 53 |
| Example 3 | 123 | 50 | 54 | 49 | 51 | 52 | 55 | 52 | 57 | 51 |
| Example 4 | 123 | 54 | 51 | 52 | 53 | 55 | 56 | 54 | 52 | 51 |
| Comparative Example | 123 | 124 | 125 | 123 | 123 | 125 | 123 | 124 | 125 | 124 |

As can be seen from Table 1, the acidity of PGMEA that has passed through the porous adsorbent according to Examples 1 to 4 of the present invention was significantly reduced from the initial 123 ppm to 49 to 57 ppm, whereas according to Comparative Example, the acidity of PGMEA that has passed through the porous adsorbent impregnated with water was maintained at a level equal to or higher than the initial 123 ppm.

Therefore, it can be confirmed that the acidity can be significantly lowered just by passing the raw material PGMEA through the porous adsorbent.

Table 2 below shows the amount of PM remaining in the PGMEA that has passed through the porous adsorbent.

TABLE 2

Residual amount of PM after passing through the porous adsorbent (Unit: ppm)

| Passage rate | Feed | 0-50 | 50-100 | 100-150 | 150-200 | 200-250 | 250-300 | 300-350 | 350-400 | 400-450 |
|---|---|---|---|---|---|---|---|---|---|---|
| Example 1 | 48 | 46 | 51 | 49 | 48 | 50 | 46 | 47 | 48 | 44 |
| Example 2 | 48 | 47 | 50 | 49 | 49 | 48 | 48 | 49 | 47 | 47 |
| Example 3 | 48 | 47 | 51 | 50 | 48 | 51 | 48 | 48 | 47 | 47 |
| Example 4 | 48 | 47 | 46 | 49 | 47 | 50 | 48 | 49 | 49 | 46 |
| Comparative Example | 48 | 47 | 50 | 49 | 49 | 50 | 49 | 48 | 49 | 48 |

As can be seen in Table 2, it can be confirmed that even if the porous adsorbent is passed through, PM, which is an impurity, is hardly removed.

Therefore, it can be confirmed that in view of the fact that the residual amount of PM is within the same level range as the initial value of the experiment, it is difficult to effectively remove impurities only by passing through the porous adsorbent.

Table 3 below shows the acidity and the amount of PM of PGMEA that has passed through the distillation process.

TABLE 3

Acidity of PGMEA and residual amount of PM after distillation process

|  | Acidity | Residual amount of PM |
| --- | --- | --- |
|  |  | (unit: ppm) |
| Example 1 | 14 | 21 |
| Example 2 | 15 | 20 |
| Example 3 | 14 | 22 |
| Example 4 | 15 | 20 |
| Comparative Example | 124 | 49 |

Through Table 3, it can be confirmed that according to Examples of the present invention, if PGMEA, which maintains an acidity of 49-57 ppm, is distilled after adding an antioxidant, the acidity can be significantly reduced to a level of 14-15 ppm, whereas it is difficult to lower the acidity according to Comparative Example.

Therefore, it can be confirmed that when the distillation process is performed by adding an antioxidant, the amount of impurity PM contained in PGMEA, which was 44-51 ppm, can be significantly reduced to a 20-22 ppm level through the distillation process, whereas it can be confirmed that according to Comparative Example, almost no impurities can be removed.

Table 4 below shows the acidity measured after PGMEA that has passed through a distillation process is passed through a basic ion exchange resin.

TABLE 4

Acidity of PGMEA after passing through basic ion exchange resin (Unit: ppm)

| Passage rate | 0-50 | 50-100 | 100-150 | 150-200 | 200-250 | 250-300 | 300-350 | 350-400 | 400-450 |
| --- | --- | --- | --- | --- | --- | --- | --- | --- | --- |
| Example 1 | 5 | 6 | 4 | 4 | 5 | 4 | 5 | 4 | 5 |
| Example 2 | 5 | 5 | 4 | 5 | 5 | 5 | 5 | 5 | 4 |
| Example 3 | 5 | 5 | 5 | 4 | 6 | 4 | 6 | 5 | 5 |
| Example 4 | 5 | 5 | 5 | 4 | 6 | 6 | 5 | 4 | 5 |
| Comparative Example | 40 | 41 | 45 | 89 | 126 | 123 | 124 | 126 | 124 |

Referring to Table 4, it can be confirmed that when passed through a basic ion exchange resin, in the case of Examples of the present invention, the acidity from 14 to 15 ppm before passage can be significantly reduced to 4 to 6 ppm, whereas according to Comparative Example, the acidity significantly increases as the amount of PGMEA passing through is accumulated.

Table 5 below shows the residual amount of PM measured after PGMEA that has passed through a distillation process is passed through a basic ion exchange resin.

TABLE 5

Residual amount of PM after passing through basic ion exchange resin (Unit: ppm)

| Passage rate | 0-50 | 50-100 | 100-150 | 150-200 | 200-250 | 250-300 | 300-350 | 350-400 | 400-450 |
| --- | --- | --- | --- | --- | --- | --- | --- | --- | --- |
| Example 1 | 21 | 19 | 18 | 17 | 20 | 21 | 20 | 21 | 19 |
| Example 2 | 21 | 18 | 20 | 18 | 19 | 19 | 20 | 19 | 18 |
| Example 3 | 21 | 19 | 20 | 18 | 20 | 19 | 20 | 20 | 20 |
| Example 4 | 21 | 18 | 19 | 18 | 19 | 20 | 20 | 20 | 20 |
| Comparative Example | 50 | 51 | 51 | 49 | 48 | 47 | 49 | 49 | 50 |

Referring to Table 5, when passing through the basic ion exchange resin, there is no significant difference in the residual amount of PM before and after passage in the case of Examples or Comparative Examples of the present invention.

Therefore, when purifying (preparing) PGMEA according to the present invention, it can be confirmed that high-purity PGMEA can be obtained while remarkably lowering the acidity, which meets the specifications required for semiconductor grade.

Figure 3:
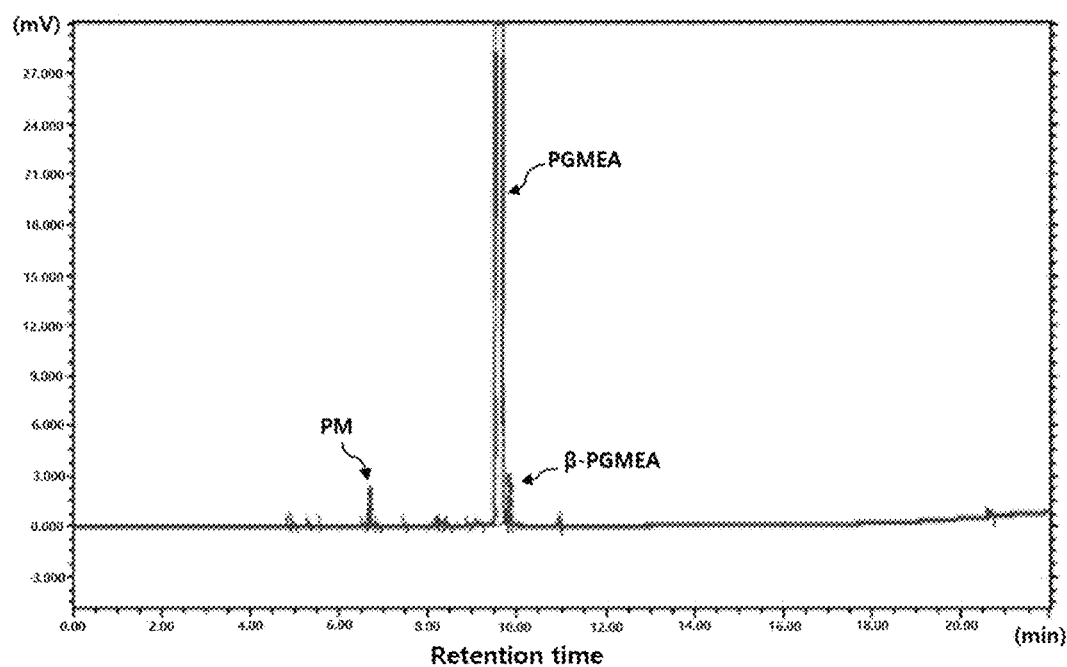
FIG. 3 is a gas chromatogram of PGMEA purified according to an embodiment of the present invention.
Figure 4:
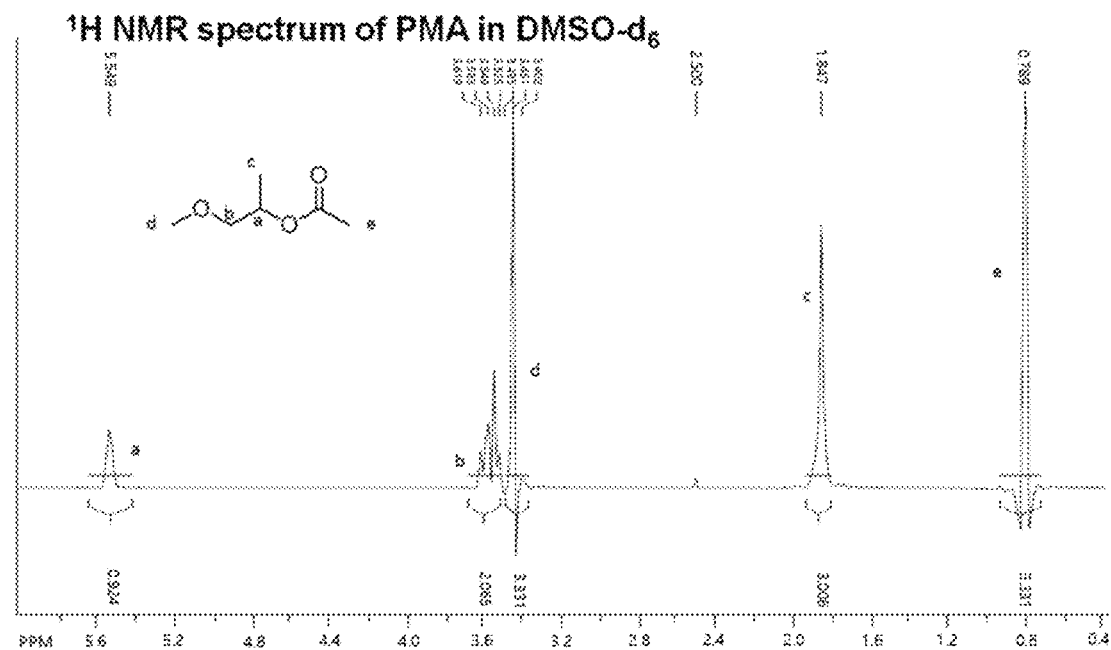
FIG. 4 is an NMR spectrum of PGMEA purified according to an embodiment of the present invention.

FIG. 2 is a gas chromatogram before purification of industrial PGMEA as a raw material, FIG. 3 is a gas chromatogram of PGMEA purified according to Example 1 of the present invention, and FIG. 4 is an NMR spectrum of PGMEA purified according to Example 1 of the present invention.

Table 6 below shows the peak height, area, area %, and component name according to the retention time before purification of PGMEA, a chart of which is shown in FIG. 2. In the component name, UK means an unknown substance, Purity means pure PGMEA, and Isomer means an isomer such as β-PGMEA.

TABLE 6

| Retention time [min] | Label | Height [uV] | Area [uV * sec] | Area % [%] | Component name |
| --- | --- | --- | --- | --- | --- |
| 4.853 | BB | 29 | 39 | 0.00016 | UK1 |
| 4.957 | BB | 78 | 178 | 0.00073 | UK2 |
| 5.310 | BB | 180 | 328 | 0.00135 | UK3 |
| 5.547 | BB | 23 | 31 | 0.00013 | UK4 |
| 6.550 | BV | 105 | 214 | 0.00088 | UK5 |
| 6.697 | VV | 2227 | 4198 | 0.01723 | PM |
| 6.887 | VB | 124 | 245 | 0.00101 | UK6 |
| 7.473 | BB | 28 | 60 | 0.00025 | UK7 |
| 8.223 | BV | 520 | 1068 | 0.00439 | UK8 |
| 8.317 | VV | 200 | 451 | 0.00185 | UK9 |
| 8.460 | VB | 92 | 202 | 0.00083 | UK10 |
| 8.893 | BB | 43 | 110 | 0.00045 | UK11 |
| 9.150 | BB | 212 | 518 | 0.00213 | UK12 |
| 9.670 | BOV | 4469297 | 24344610 | 99.94011 | Purity |
| 9.837 | VB | 2872 | 5630 | 0.02311 | Isomer |
| 10.953 | BV | 117 | 184 | 0.00075 | UK13 |
| 10.986 | VB | 106 | 162 | 0.00067 | UK14 |
| 20.656 | BB | 342 | 971 | 0.00398 | UK15 |

Table 7 below shows the peak height, area, area %, and component name according to the retention time after purification of PGMEA, a chart of which is shown in FIG. 3.

TABLE 7

| Residual time [min] | Label | Hight [uV] | Area [uV * sec] | Area % [%] | Component name |
|---|---|---|---|---|---|
| 6.700 | BB | 52 | 102 | 0.00041 | PM |
| 9.670 | BOV | 4539001 | 25091163 | 99.99483 | Purity |
| 9.837 | VB | 619 | 1195 | 0.00476 | β-Isomer |

Referring to FIGS. 2 and 3, and Tables 6 and 7, it can be confirmed that before purification, unknown impurities, isomers, and impurities such as PM are contained, and the purity of PGMEA is 99.94011%, whereas after purification, all unknown impurities are removed and a large amount of PM and isomers are also removed, so that the amount is significantly reduced and as a result, the purity of PGMEA is maintained at 99.994836%.

In addition, it can be confirmed through the NMR spectrum of FIG. 4 that the product produced according to Examples of the present invention is PGMEA.

Although exemplary embodiments of the present invention have been described for illustrative purposes only, those skilled in the art will appreciate that various modifications, additions and substitutions are possible, without departing from the scope and spirit of the disclosure. Therefore, exemplary embodiments of the present invention have not been described for limiting purposes. Accordingly, the scope of the disclosure is not to be limited by the above embodiments but should be construed by the following claims, and all techniques within a range equivalent thereto should be construed as being included within the spirit and scope of the present invention.

The invention claimed is:

1. A method of purifying an alkylene glycol monoalkyl ether carboxylic acid ester for photoresist process, comprising the steps of:
    impregnating a porous adsorbent with a basic material;
    lowering the acidity by passing an alkylene glycol monoalkyl ether carboxylic acid ester (AGAECE) as a raw material through the porous adsorbent impregnated with a basic material; and
    distilling the AGAECE that has passed through the porous adsorbent,
    wherein the AGAECE is represented by Formula 1, and an antioxidant is added in the distillation step:

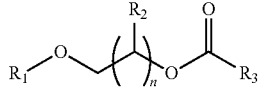

<Formula 1> wherein $R_1$ is hydrogen or a $C_1$-$C_8$ alkyl group, $R_2$ and $R_3$ are each independently hydrogen or a $C_1$-$C_{11}$ alkyl group, and n is an integer of 1 to 11, provided that when n is an integer of 2 or more, each $R_2$ is the same as or different from each other.

2. The method for purifying an alkylene glycol monoalkyl ether carboxylic acid ester for photoresist process of claim 1, further comprising a step of passing the distilled AGAECE through a basic ion exchange resin.

3. The method for purifying an alkylene glycol monoalkyl ether carboxylic acid ester for photoresist process of claim 1, wherein the AGAECE is propylene glycol methyl ether acetate (PGMEA).

4. The method for purifying an alkylene glycol monoalkyl ether carboxylic acid ester for photoresist process of claim 1, wherein the purity of the raw material AGAECE is 99.90 to 99.95%, and the acidity of the raw material is 20 ppm or more.

5. The method for purifying an alkylene glycol monoalkyl ether carboxylic acid ester for photoresist process of claim 1, wherein the acidity of AGAECE after the step of distilling is less than 20 ppm.

6. The method for purifying an alkylene glycol monoalkyl ether carboxylic acid ester for photoresist process of claim 2, wherein:
    the AGAECE is PGMEA,
    propylene glycol methyl ether as an impurity is contained in an amount of 45 ppm or more in the raw material PGMEA, and the acidity of the raw material PGMEA is more than 100 ppm,
    the acidity of PGMEA after the step of distilling is less than 20 ppm, and the acidity of PGMEA after passing through the basic ion exchange resin is 10 ppm or less, and
    the content of propylene glycol methyl ether contained in PGMEA is 25 ppm or less after the step of distilling, and 20 ppm or less after passing through the basic ion exchange resin.

7. The method for purifying an alkylene glycol monoalkyl ether carboxylic acid ester for photoresist process of claim 1, wherein the basic material is selected from the group consisting of KOH, NaOH, Ba(OH)$_2$, CsOH, Sr(OH)$_2$, Ca(OH)$_2$, LiOH, RbOH, n-BuLi, Na$_2$CO$_3$, NaH, NaHCO$_3$, K$_2$CO$_3$, KHCO$_3$, CaCO$_3$, CaHCO$_2$, LDA (Lithium diisopropylamide), LDEA (Lithium diethylamide) and ((CH$_3$)$_3$Si)$_2$NLi (Lithium bis(trimethylsilyl)amide).

8. The method for purifying an alkylene glycol monoalkyl ether carboxylic acid ester for photoresist process of claim 1, wherein the porous adsorbent is selected from the group consisting of mesoporous silica, zeolite, porous metal oxide, porous clay, activated carbon, porous activated alumina, aerogel, and MOF (metal-organic framework), and combinations thereof.

9. The method for purifying an alkylene glycol monoalkyl ether carboxylic acid ester for photoresist process of claim 1, wherein the AGAECE passes through the porous adsorbent impregnated with the basic material with maintaining 1 to 4 times the rate of passage per hour relative to the volume (m$^3$) of the porous adsorbent.

10. The method for purifying an alkylene glycol monoalkyl ether carboxylic acid ester for photoresist process of claim 1, wherein the distillation temperature is 80-140° C. in the step of distilling.

* * * * *